(12) United States Patent
Wu et al.

(10) Patent No.: US 11,622,488 B2
(45) Date of Patent: Apr. 4, 2023

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventors: Feng Wu, Hefei (CN); Sang Yeol Park, Hefei (CN)

(73) Assignee: GHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/439,894

(22) PCT Filed: Jun. 22, 2021

(86) PCT No.: PCT/CN2021/101614
§ 371 (c)(1),
(2) Date: Sep. 16, 2021

(87) PCT Pub. No.: WO2022/095462
PCT Pub. Date: May 12, 2022

(65) Prior Publication Data
US 2022/0271038 A1    Aug. 25, 2022

(30) Foreign Application Priority Data
Nov. 5, 2020 (CN) .......................... 202011223554.X

(51) Int. Cl.
*H10B 12/00* (2023.01)
*H01L 23/00* (2006.01)

(52) U.S. Cl.
CPC ........... *H10B 12/30* (2023.02); *H01L 23/562* (2013.01); *H10B 12/03* (2023.02); *H10B 12/09* (2023.02); *H10B 12/50* (2023.02)

(58) Field of Classification Search
CPC ............. H01L 27/10805; H01L 23/562; H01L 27/1085; H01L 27/10894; H01L 27/10897
See application file for complete search history.

(56) References Cited

U.S. PATENT DOCUMENTS

| 6,294,294 B1 | 9/2001 | Honigschmid et al. |
| 6,893,914 B2 | 5/2005 | Kim et al. |
| (Continued) | | |

FOREIGN PATENT DOCUMENTS

| CN | 1469457 A | 1/2004 |
| CN | 1841672 A | 10/2006 |
| (Continued) | | |

OTHER PUBLICATIONS

International Search Report and English Translation cited in PCT/CN2021/101614 dated Sep. 9, 2021, 9 pages.

(Continued)

*Primary Examiner* — Edward Chin
(74) *Attorney, Agent, or Firm* — Cooper Legal Group, LLC

(57) ABSTRACT

The present application provides a semiconductor structure and a manufacturing method thereof, and relates to the field of display technology. The semiconductor structure includes a substrate. The substrate includes an array region and a peripheral circuit region surrounding the array region. Multiple capacitors are arranged in an array in the array region. Virtual lines connecting centers of any three consecutively adjacent capacitors among the multiple capacitors located at an edge of the array region define a virtual angle greater than 90°.

13 Claims, 10 Drawing Sheets

---

Provide a substrate, the substrate including an array region and a peripheral circuit region surrounding the array region Form a support layer on the substrate Form multiple capacitors in the support layer corresponding to the array region, the multiple capacitors are arranged in an array in the array region; virtual lines connecting centers of any Three consecutively adjacent capacitors among multiple the capacitors located at an edge of the array region define a virtual angle greater than 90°

(56) References Cited

U.S. PATENT DOCUMENTS

| | | | |
|---|---|---|---|
| 7,157,328 B2 | 1/2007 | Tews et al. | |
| 10,700,071 B1 | 6/2020 | Lin et al. | |
| 2005/0054159 A1* | 3/2005 | Manning | H01L 27/10852 |
| | | | 257/E21.648 |
| 2020/0203357 A1* | 6/2020 | Chhajed | H01L 29/7827 |

FOREIGN PATENT DOCUMENTS

| | | | | |
|---|---|---|---|---|
| CN | 103545287 A | | 1/2014 | |
| CN | 107706206 A | | 2/2018 | |
| CN | 107731794 A | | 2/2018 | |
| CN | 108336068 A | | 7/2018 | |
| CN | 108519725 A | | 9/2018 | |
| CN | 108987346 A | | 12/2018 | |
| CN | 111403343 A | | 7/2020 | |
| CN | 112864154 A | * | 5/2021 | ....... H01L 27/10805 |

OTHER PUBLICATIONS

Written Opinion and English Translation cited in PCT/CN2021/101614 dated Sep. 9, 2021, 8 pages.

* cited by examiner

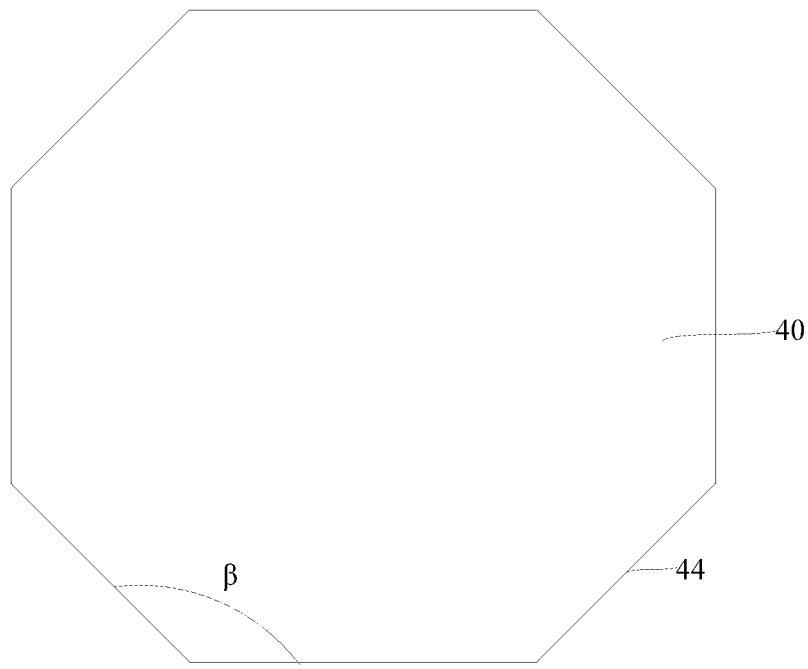

FIG. 9

```
Provide a substrate, the substrate including an array region and a peripheral
circuit region surrounding the array region
                                    |
                                    |
                    Form a support layer on the substrate
                                    |
                                    |
Form multiple capacitors in the support layer corresponding to the array region,
the multiple capacitors are arranged in an array in the array region; virtual lines
 connecting centers of any Three consecutively adjacent capacitors among
 multiple the capacitors located at an edge of the array region define a virtual
                          angle greater than 90°
```

FIG. 10

US 11,622,488 B2

SEMICONDUCTOR STRUCTURE AND MANUFACTURING METHOD THEREOF

CROSS-REFERENCE TO RELATED APPLICATION

The present application is a national stage entry of International Application No. PCT/CN2021/101614, filed on Jun. 22, 2021, which claims the priority to Chinese Patent Application 202011223554.X, titled "SEMICONDUCTOR STRUCTURE AND MANUFACTURING METHOD THEREOF", filed with China National Intellectual Property Administration (CNIPA) on Nov. 5, 2020. The entire contents of International Application No. PCT/CN2021/101614 and Chinese Patent Application 202011223554.X are incorporated herein by reference.

TECHNICAL FIELD

The present application relates to the field of semiconductor technology, and in particular to a semiconductor structure and a manufacturing method thereof.

BACKGROUND

The dynamic random access memory (DRAM) is a semiconductor memory that randomly writes and reads data at high speed, and is widely used in data storage devices.

In the DRAM, the capacitor array structure includes an array region and a peripheral circuit region connected with the array region. Multiple capacitors are arranged in a rectangular array in the array region, and a driving circuit connected with each capacitor is provided in the peripheral circuit region.

When the multiple capacitors arranged in a rectangular array are manufactured, the capacitor located at the corner of the rectangular array is prone to damage, thereby affecting the storage performance of the capacitor.

SUMMARY

A first aspect of the embodiments of the present application provides a semiconductor structure. The semiconductor structure includes a substrate, where the substrate includes an array region and a peripheral circuit region surrounding the array region; multiple capacitors are arranged in an array in the array region; virtual lines connecting centers of any three consecutively adjacent capacitors among the multiple capacitors located at an edge of the array region define a virtual angle greater than 90°.

A second aspect of the embodiments of the present application provides a manufacturing method of a semiconductor structure. The manufacturing method includes:

providing a substrate, the substrate including an array region and a peripheral circuit region surrounding the array region;

forming a supporting layer on the substrate; and forming multiple capacitors in the supporting layer corresponding to the array region, where the multiple capacitors are arranged in an array in the array region; virtual lines connecting centers of any three consecutively adjacent capacitors among the multiple capacitors located at an edge of the array region define a virtual angle greater than 90°.

BRIEF DESCRIPTION OF THE DRAWINGS

FIG. 9 is a second top view of the supporting layer according to an embodiment of the present application.

FIG. 10 is a flowchart of a manufacturing method of a semiconductor structure according to an embodiment of the present application.

Figure 1:
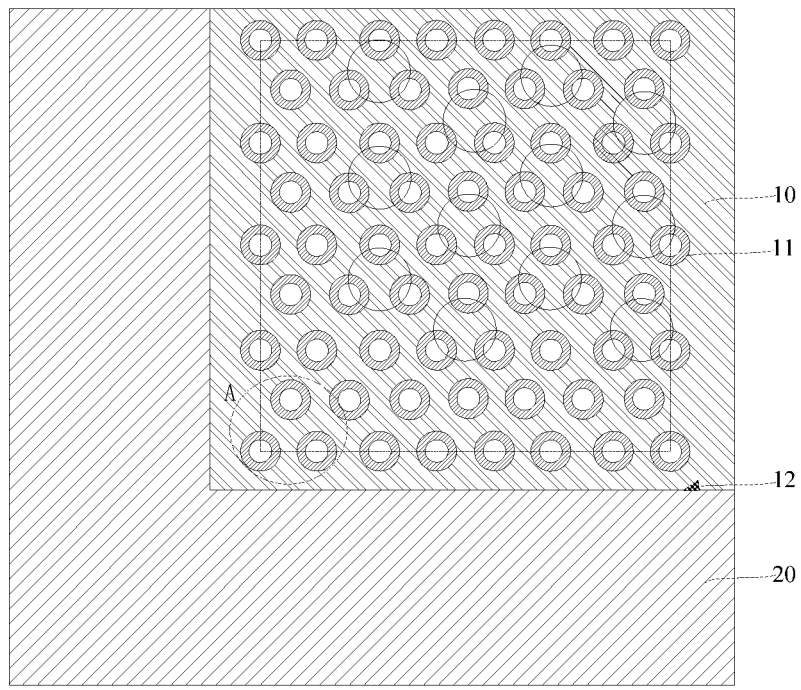
FIG. 1 is a first schematic diagram of a semiconductor structure in the related art.

REFERENCE NUMERALS 10. array region; 11. capacitor; 111. capacitor hole; 112. first electrode layer; 12. edge of array region; 13. virtual obtuse triangle; 20. peripheral circuit region; 30. substrate; 40. supporting layer; 41. top supporting layer; 42. intermediate supporting layer; 43. connecting segment; 44. straight line segment; 50. first mask pattern; 51. first shielding region; 52. first opening region; 60. second shielding region; 70. third mask pattern; 71. third shielding region; 72. third opening region; α. virtual angle.

DETAILED DESCRIPTION

The inventor of this application found in actual work, a capacitor array structure includes an array region 10 and a peripheral circuit region 20 connected with the array region 10. Multiple capacitors 11 are provided in the array region 10, and the multiple capacitors 11 are arranged in a rectangular array. That is, the multiple capacitors 11 may be divided into multiple rows of capacitor banks, and the multiple rows of capacitor banks are arranged at intervals in a column direction. The capacitors in two adjacent rows of capacitor banks may be arranged in a staggered manner to form an arrangement as shown in FIG. 1. The capacitors in two adjacent rows of capacitor banks may also be aligned to form an arrangement as shown in FIG. 2.

The density of components in the peripheral circuit region 20 and the array region 10 differs greatly, and the capacitors 11 near an edge of the array region 10 are subjected to greater stress. Therefore, in the subsequent etching, development or exposure process, the capacitors 11 near the edge of the array region 10 are prone to damage. For example, the capacitors 11 are prone to collapse. The above phenomenon is called a loading effect.

Figure 2:
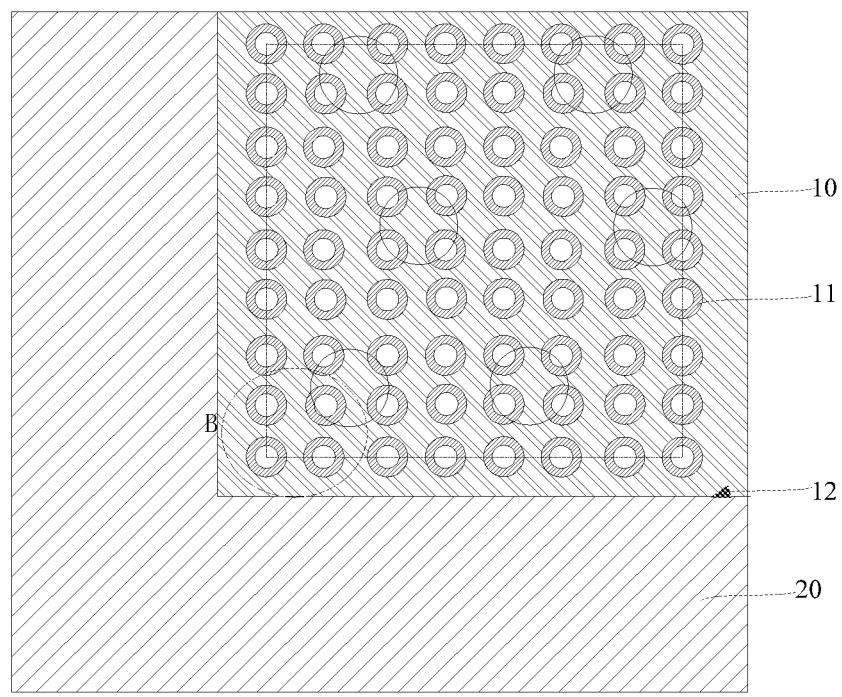
FIG. 2 is a second schematic diagram of the semiconductor structure in the related art.

In particular, the capacitor 11 located at a corner of the rectangular array region, that is, the capacitor 11 in region A shown in FIG. 1 and the capacitor 11 in region B shown in FIG. 2, are subjected to the stress of the peripheral circuit region and the stress of two adjacent right-angle sides of the rectangular array region. Therefore, the stress at the corner of the array region 10 is concentrated, and the capacitor 11 at the corner of the array region 10 is prone to damage due to the loading effect, which will affect the storage performance of the capacitor 11.

In view of the above technical problem, the embodiments of the present application provide a semiconductor structure and a manufacturing method thereof. In the present application, virtual lines connecting centers of any three consecutively adjacent capacitors among multiple capacitors located at an edge of an array region define a virtual angle greater than 90°. The virtual lines connecting centers of any three consecutively adjacent capacitors among the multiple capacitors located at the edge of the array region can prevented from defining at least a right angle, so as to prevent the multiple capacitors located at the edge of the array region from defining a rectangular pattern. In this way, the stress on the multiple capacitors located at the edge of the array region can be reduced, thereby reducing the probability of damage to the multiple capacitors located at the edge of the array region and improving the storage performance of the semiconductor structure.

In order to make the objectives, features and advantages of the embodiments of the present application clearer, the technical solutions in the embodiments of the present application are described clearly and completely below with reference to the accompanying drawings in the embodiments of the present application. Apparently, the described embodiments are some rather than all of the embodiments of the present application. All other embodiments obtained by a person of ordinary skill in the art based on the embodiments of the present application without creative efforts should fall within the protection scope of the present application.

Figure 3:
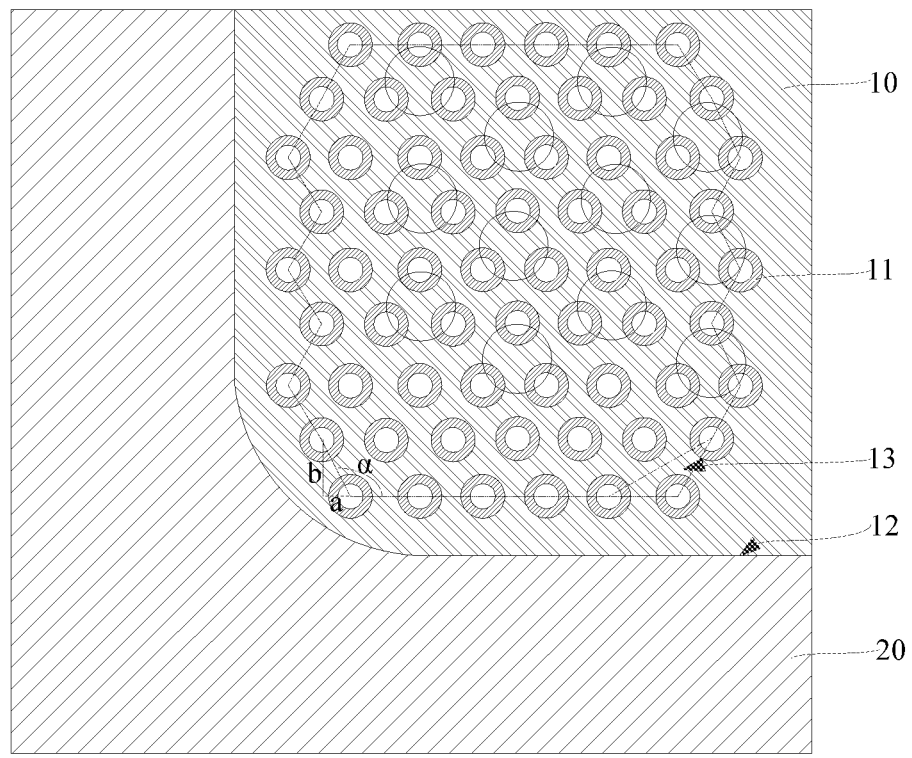
FIG. 3 is a first schematic diagram of a semiconductor structure according to an embodiment of the present application.
Figure 4:
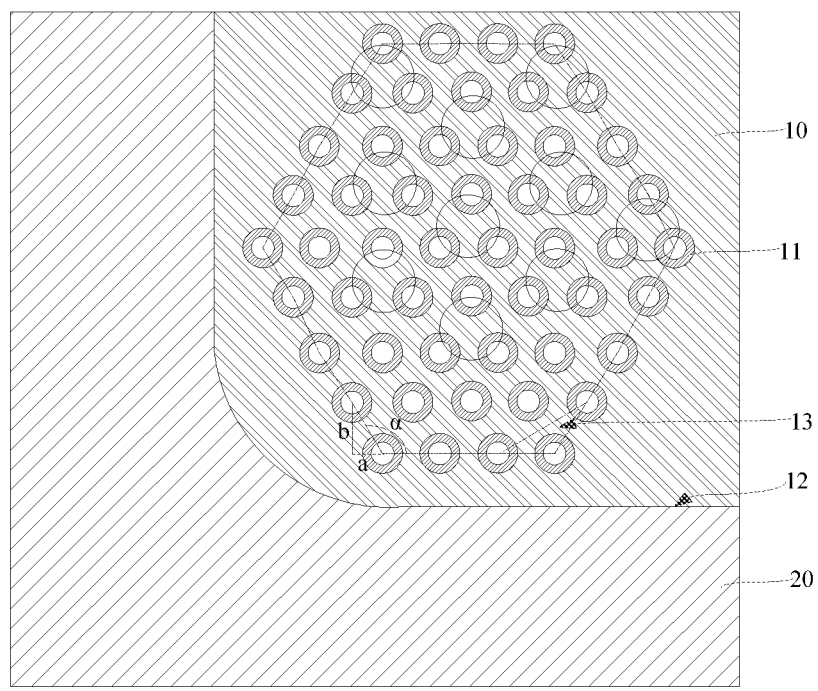
FIG. 4 is a second schematic diagram of the semiconductor structure according to an embodiment of the present application.

As shown in FIGS. 3 and 4, an embodiment of the present application provides a semiconductor structure. The semiconductor structure includes a substrate. The substrate serves as a support component of the semiconductor structure and is used to support other components provided thereon. The substrate may be made of a semiconductor material, and the semiconductor material may be one of silicon, germanium, silicon-germanium and silicon-carbon or a combination of silicon, germanium, silicon-germanium and silicon-carbon.

The semiconductor structure in the embodiments of the present application may be a memory, a transistor or other semiconductor device. In order to facilitate the following description, the following embodiments all take a memory as an example for illustration.

The substrate includes an array region 10 and a peripheral circuit region 20 surrounding the array region 10. A driving circuit is provided in the peripheral circuit region 20. The driving circuit is configured to electrically connect with a capacitor 11 in the array region 10 to provide a driving signal for the capacitor 11.

It should be noted that the surrounding in this embodiment may be understood as half surrounding. In other words, the peripheral circuit region 20 may be provided on two sides of the array region 10 opposite to each other, or the peripheral circuit region 20 may surround two adjacent sides of the array region 10. Alternatively, the surrounding may be understood as full surrounding, that is, the peripheral circuit region 20 may be provided around the array region 10.

Multiple capacitors 11 are provided in the array region 10. The multiple capacitors 11 are arranged in an array in the array region 10, that is, the multiple capacitors 11 are distributed in the array region 10 according to a certain rule. For example, the multiple capacitors 11 may be arranged in the array region 10 in a circular array. Virtual lines connecting centers of any three consecutively adjacent capacitors among multiple capacitors 11 located at an edge 12 of the array region define a virtual angle α greater than 90°. That is, one of center points of any consecutively adjacent three capacitors 11 serves as a vertex and lines connecting the other two center points with the vertex serve as two sides to define one virtual angle α. The other two center points serve as a vertex respectively to define the other two virtual angles α. One of the three virtual angles α is greater than 90°. In other words, the virtual angle α may be an obtuse angle or a straight angle.

In the related art, as shown in FIG. 1, center lines of three adjacent capacitors among multiple capacitors 11 located at an edge 12 of an array region define at least one right angle. That is, a first capacitor and a second capacitor in a capacitor bank in a first row and a first capacitor in a capacitor bank in a third row define a right triangle. Alternatively, as shown in FIG. 2, center lines of three adjacent capacitors among multiple capacitors 11 located at an edge 12 of an array region define at least one right angle. That is, a first capacitor and a second capacitor in a capacitor bank in a first row and a first capacitor in a capacitor bank in a second row define a right triangle. In this way, the multiple capacitors 11 located at the edge 12 of the array region define a rectangular pattern. The rectangular arrangement increases the probability of damage to the capacitor 11 located at the corner of the rectangle, that is, it increases the probability of damage to the capacitor located in region A in FIG. 1 and the capacitor located in region B in FIG. 2, thereby deteriorating the storage performance of the semiconductor structure.

In this embodiment, the virtual lines connecting centers of any three consecutively adjacent capacitors 11 among the multiple capacitors 11 located at the edge 12 of the array region define a virtual angle α greater than 90°, such that the multiple capacitors 11 located at the edge 12 of the array region define a non-rectangular pattern. In this way, the stress on the multiple capacitors 11 located at the edge 12 of the array region can be reduced. In the subsequent etching, development or exposure process, the loading effect at the edge 12 of the array region can be reduced, thereby reducing the probability of damage to the multiple capacitors 11 located at the edge 12 of the array region and improving the storage performance of the semiconductor structure.

It should be noted that in this embodiment, the edge 12 of the array region may be understood as a boundary line between the array region 10 and the peripheral circuit region 20.

In some embodiments, the multiple capacitors 11 arranged in an array include multiple rows of capacitor banks and multiple columns of capacitor banks. The multiple capacitors 11 located at the edge 12 of the array region include the capacitors located at end points of both the multiple rows of capacitor banks and the multiple columns of capacitor banks.

It should be noted that, in this embodiment, the capacitors 11 at the end points of the multiple rows of capacitor banks refer to a first capacitor 11 and a last capacitor 11 of each row of capacitor bank, and the capacitors 11 at the end points of the multiple columns of capacitor banks refer to a first capacitor 11 and a last capacitor 11 of each column of capacitor bank.

In this embodiment, multiple capacitors 11 form a row of capacitor bank. In multiple rows of capacitor banks formed by multiple capacitors, the multiple rows of capacitor banks are arranged at intervals along a column direction that is perpendicular to a row direction. Alternatively, the multiple capacitors may be divided into multiple columns of capacitor banks, and the multiple columns of capacitor banks are arranged at intervals along the row direction.

The virtual lines connecting centers of the first capacitor 11 and the last capacitor 11 in each row of capacitor bank and the first capacitor 11 and the last capacitor 11 in each column of capacitor bank define a polygon. In this polygon, the virtual lines connecting centers of any three consecutively adjacent capacitors 11 define a virtual angle α greater than 90°, such that the multiple capacitors 11 located at the edge 12 of the array region define a non-rectangular pattern. In this way, the stress on the multiple capacitors 11 located at the edge 12 of the array region can be reduced. In the subsequent etching, development or exposure process, the loading effect at the edge 12 of the array region can be reduced, thereby reducing the probability of damage to the multiple capacitors 11 located at the edge 12 of the array region and improving the storage performance of the semiconductor structure.

In some embodiments, virtual lines connecting centers of all the capacitors 11 located at the end points of the multiple rows of capacitor banks and the multiple columns of capacitor banks define a rectangle with a chamfer. That is, the center lines of all the capacitors 11 in the first row of capacitor bank, all the capacitors 11 in the last row of capacitor bank and the capacitors 11 at the end points of the multiple rows of capacitor banks located between the first row of capacitor bank and the last row of capacitor bank define a rectangle with a chamfer.

The arrangement of the multiple capacitors 11 in the array region 10 may be described in the following two implementations. It should be noted that the following two implementations are only illustrative of two possible implementations, rather than to limit the arrangement of the multiple capacitors in the array region.

In one implementation, in any two adjacent rows of capacitor banks, the capacitors 11 in one row of capacitor bank and the capacitors 11 in the other row of capacitor bank may be arranged in a staggered manner. For example, as shown in FIG. 3, a first capacitor and a second capacitor in a first row of capacitor bank and a first capacitor in a second row of capacitor bank define a virtual obtuse triangle 13. A first capacitor in an eighth row of capacitor bank and a first capacitor and a second capacitor in a ninth row of capacitor bank define a virtual obtuse triangle 13. In the second to eighth rows of capacitor banks, the virtual lines connecting centers of the first capacitors in any three adjacent rows of capacitor banks define a virtual obtuse triangle 13. The multiple capacitors located at the edge 12 of the array region are prevented from defining a right angle. In this way, the stress on the multiple capacitors 11 located at the edge 12 of the array region can be reduced. In the subsequent etching, development or exposure process, the loading effect at the edge 12 of the array region can be reduced, thereby reducing the probability of damage to the multiple capacitors 11 located at the edge 12 of the array region and improving the storage performance of the semiconductor structure.

For another example, as shown in FIG. 4, a first capacitor and a second capacitor in a first row of capacitor bank and a first capacitor in a second row of capacitor bank define a virtual obtuse triangle 13. A first capacitor in an eighth row of capacitor bank and a first capacitor and a second capacitor in a ninth row of capacitor bank define a virtual obtuse triangle 13. In the second to eighth rows of capacitor banks, the virtual lines connecting centers of the first capacitors in any three adjacent rows of capacitor banks may also define a straight angle. The multiple capacitors 11 located at the edge 12 of the array region, that is, the virtual lines connecting centers of the capacitors 11 located at the end points of both the multiple rows of capacitor banks and the multiple columns of capacitor banks, define a hexagon, and the internal angles of the hexagon are all obtuse angles. The multiple capacitors located at the edge of the array region are prevented from defining a right angle. In this way, the stress on the multiple capacitors 11 located at the edge 12 of the array region can be reduced. In the subsequent etching, development or exposure process, the loading effect at the edge 12 of the array region can be reduced, thereby reducing the probability of damage to the multiple capacitors 11 located at the edge 12 of the array region and improving the storage performance of the semiconductor structure.

In the structure shown in FIG. 4, the number of capacitors 11 in each row of capacitor bank increases first and then decreases. In other words, the center line of the fifth row of capacitor bank serves as a symmetry axis, and the remaining rows of capacitor banks are symmetrically distributed on two sides of the symmetry axis. Among the first to fourth rows of capacitor banks, the number of capacitors 11 in each row of capacitor bank increases sequentially. Among the sixth to ninth rows of capacitor banks, the number of capacitors in each row of capacitor bank decreases sequentially.

Figure 5:
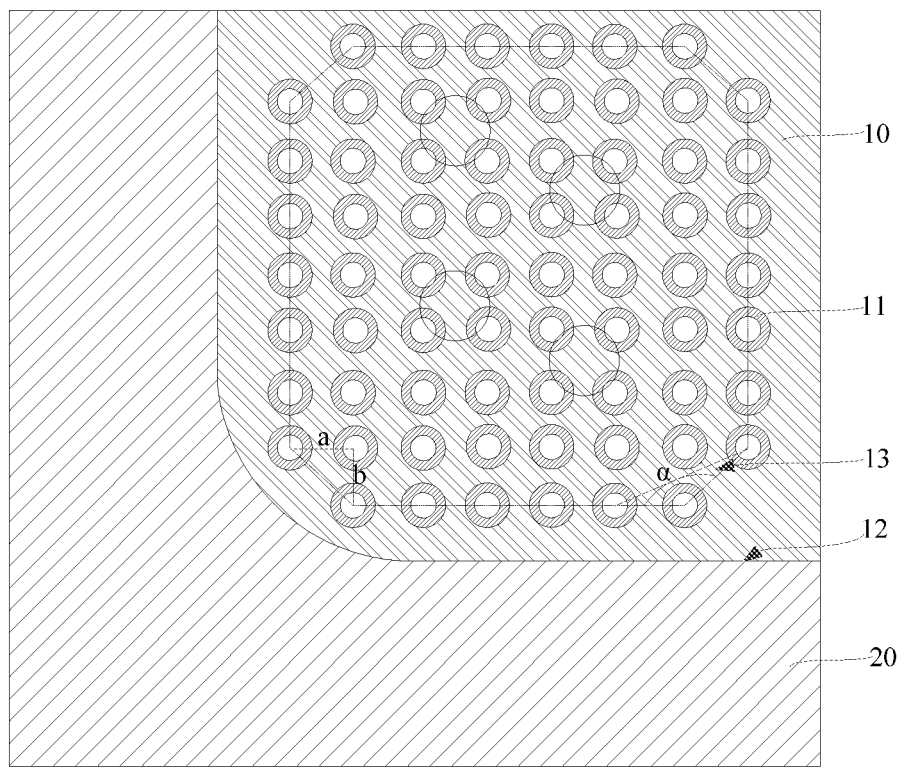
FIG. 5 is a third schematic diagram of the semiconductor structure according to an embodiment of the present application.

In the other implementation, in any two adjacent rows of capacitor banks, the capacitors 11 in one row of capacitor bank may be aligned with the capacitors 11 in the other row of capacitor bank. For example, as shown in FIG. 5, in the semiconductor structure provided by the embodiment of the present application, multiple capacitors are divided into nine rows of capacitor banks. The number of capacitors in the first row of capacitor bank is equal to that in the last row of capacitor bank, and the number of capacitors in the first row of capacitor bank is less than that in the remaining rows of capacitor banks. Therefore, the virtual lines connecting centers of the multiple capacitors located at the edge 12 of the array region, that is, the capacitors 11 located at the end points of the multiple rows of capacitor banks and the multiple columns of capacitor banks define an octagon, and the internal angles of the octagon are all obtuse angles.

Figure 6:
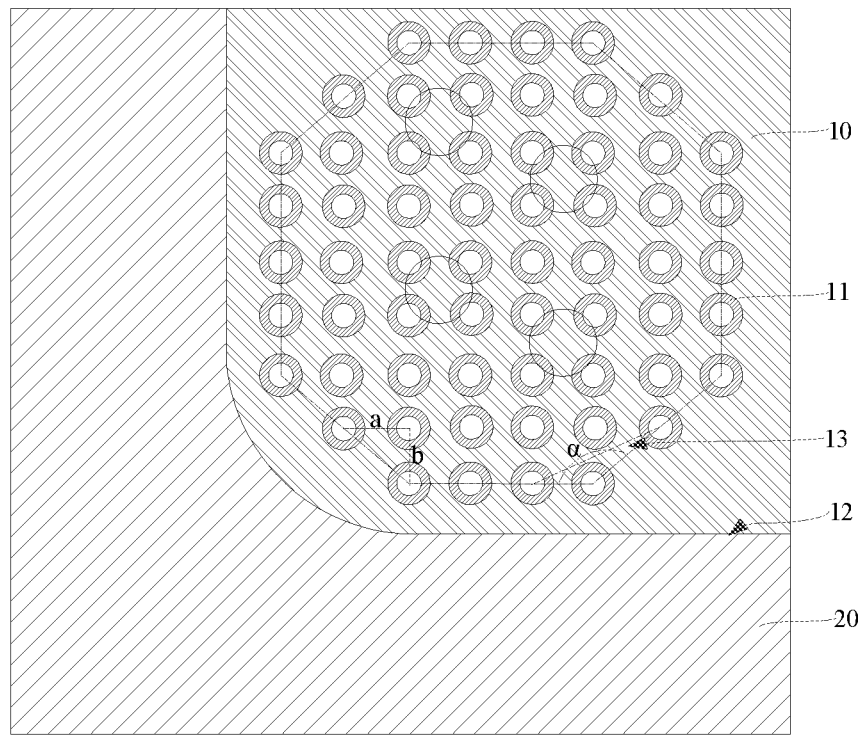
FIG. 6 is a fourth schematic diagram of the semiconductor structure according to an embodiment of the present application.

For another example, as shown in FIG. 6, the number of capacitors 11 in the first row of capacitor bank is equal to the number of capacitors 11 in the last row of capacitor bank, the number of capacitors 11 in the second row of capacitor bank is equal to the number of capacitors 11 in the eighth row of capacitor bank, and the number of capacitors 11 in the first row of capacitor bank is less than the number of capacitors 11 in the second row of capacitor bank. Therefore, the virtual lines connecting centers of the multiple capacitors 11 located at the edge 12 of the array region, that is, the capacitors 11 located at the end points of the multiple rows of capacitor banks and the multiple columns of capacitor banks define an octagon, and the internal angles of the octagon are all obtuse angles.

In this embodiment, through the above design, the multiple capacitors 11 located at the edge 12 of the array region define a non-rectangular pattern. In this way, the stress on the multiple capacitors 11 located at the edge 12 of the array region can be reduced. In the subsequent etching, development or exposure process, the loading effect at the edge 12 of the array region can be reduced, thereby reducing the probability of damage to the multiple capacitors 11 located at the edge 12 of the array region and improving the storage performance of the semiconductor structure.

In some embodiments, in the rectangle with a chamfer, the virtual lines connecting any two centers of the capacitors respectively located on two adjacent right-angled sides and one center of the capacitor located on the chamfer between the two right-angled sides define a virtual obtuse triangle.

In the subsequent etching, development or exposure process, the loading effect preferentially occurs at the corner of the rectangle. Therefore, the virtual lines connecting any two centers of the capacitors 11 respectively located on two adjacent right-angled sides and one center of the capacitor 11 located on the chamfer between the two right-angled sides define a virtual obtuse triangle 13, and the two adjacent right-angled sides of the rectangle define a chamfer. In this way, the loading effect at the corner of the rectangle is reduced, thereby reducing the probability of damage to the multiple capacitors 11 located at the edge 12 of the array region and improving the storage performance of the semiconductor structure.

In some embodiments, the capacitors 11 located at the end points of adjacent rows are also located on different columns, and the capacitors 11 located at the end points of adjacent columns are also located on different rows.

That is, in two adjacent rows of capacitor banks, the capacitors 11 at the end points of one row of capacitor bank and the capacitors 11 at the end points of the other row of capacitor bank are located in different columns. In two adjacent columns of capacitor banks, the capacitors 11 at the end points of one column of capacitor bank and the capacitors 11 at the end points of the other column of capacitor bank are located in different rows.

Specifically, as shown in FIG. 3, in the semiconductor structure provided by this embodiment, the multiple capacitors 11 are divided into nine rows of capacitor banks. In this embodiment, the first capacitor in the first row of capacitor bank and the first capacitor in the second row of capacitor bank are located in the third and second columns, respectively. The first capacitor in the first column of capacitor bank and the first capacitor in the second column of capacitor bank are located in the third and second rows, respectively. The capacitors at the end points of the other two adjacent rows or columns of capacitor banks are also located in different columns or rows, which will not be repeated here.

For another example, as shown in FIG. 4, the first capacitor in the first row of capacitor bank and the first capacitor in the second row of capacitor bank are located in the fifth and fourth columns, respectively. The first capacitor in the first column of capacitor bank and the first capacitor in the second column of capacitor bank are located in the fifth and fourth rows, respectively. The capacitors at the end points of the other two adjacent rows or columns of capacitor banks are also located in different columns or rows, which will not be repeated here.

In some embodiments, a perpendicular distance between two adjacent rows is not equal to a perpendicular distance between two adjacent columns. For example, as shown in FIGS. 3 and 4, the vertical distance b between adjacent rows is greater than the vertical distance a between adjacent columns. For another example, as shown in FIGS. 5 and 6, the vertical distance b between adjacent rows is less than the vertical distance a between adjacent columns. In this way, the arrangement of the multiple capacitors 11 may be adjusted according to the actual area of the array region 10.

Figure 7:
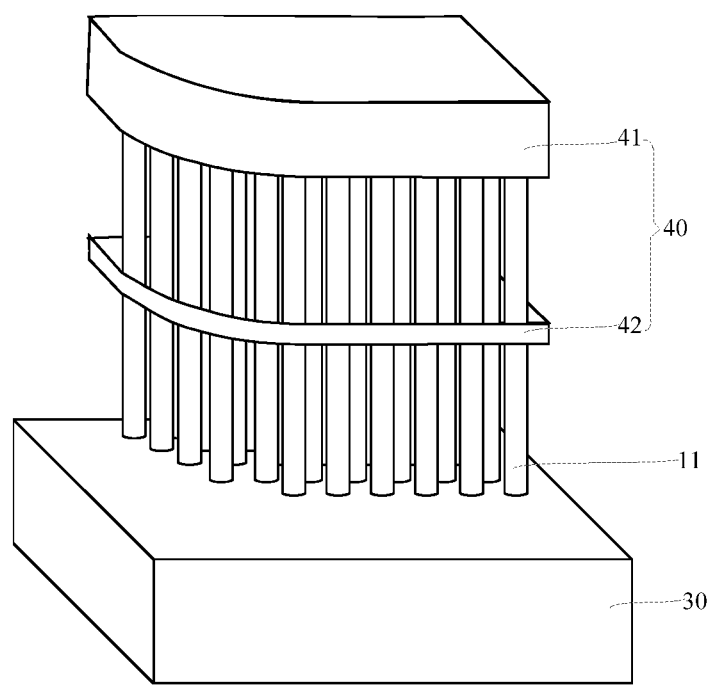
FIG. 7 is a stereoscopic view of the semiconductor structure according to an embodiment of the present application.

In some embodiments, as shown in FIG. 7, the semiconductor structure further includes a supporting layer 40 provided on a substrate 30. Multiple capacitor holes are formed on the supporting layer 40, and one capacitor 11 is provided in each of the capacitor holes.

The supporting layer 40 may be formed on the substrate 30 by deposition. Multiple capacitor holes are formed on the supporting layer 40, and the multiple capacitor holes may extend along a vertical direction, such that the bottoms of the capacitor holes are located on the substrate 30. When the capacitor 11 is formed in each capacitor hole, the capacitor 11 may be electrically connected with the peripheral circuit region 20 to realize the control of the capacitor 11 by the peripheral circuit region 20.

In this embodiment, the supporting layer 40 may separate the multiple capacitors 11 to facilitate individual control of the multiple capacitors 11. In addition, the supporting layer 40 may also support the capacitors 11 to improve the strength of the semiconductor structure.

As shown in FIG. 7, each capacitor 11 has a bottom end facing the substrate and a top end away from the substrate. The supporting layer 40 includes a top supporting layer 41, an intermediate supporting layer 42 and a bottom supporting layer (not shown in the figure). The top supporting layer 41 is located between the multiple capacitors. A top surface of the top supporting layer 41 is flush with the top ends of the capacitors 11, and a bottom surface of the top supporting layer 41 is spaced from the substrate 30. The intermediate supporting layer 42 is located between the top supporting layer 41 and the substrate 30. The bottom supporting layer is provided in the substrate 30. In this embodiment, a three-point support method is adopted to ensure the structural strength of the semiconductor.

In some embodiments, an outer contour of a cross section, of the supporting layer 40, parallel to the substrate 30 is a circle or ring. Compared with the rectangular outer contour of the cross section of the supporting layer 40 in the related art, the circular or ring-shaped outer contour reduces the stress on the supporting layer 40. In this way, in the subsequent etching, development or exposure process, the loading effect at the edge 12 of the array region is reduced, and the damage to the supporting layer 40 is reduced. Correspondingly, the probability of damage to the multiple capacitors 11 located at the edge 12 of the array region is reduced, thereby improving the storage performance of the semiconductor structure.

In some embodiments, the ring includes multiple connecting segments 43 connected end to end in sequence, and an arc is adopted for transition between the two connecting segments 43 that are at least partially adjacent. An angle β between a tangent direction of the arc between the two connecting segments and the connecting segments connected by the arc is an obtuse angle.

Figure 8:
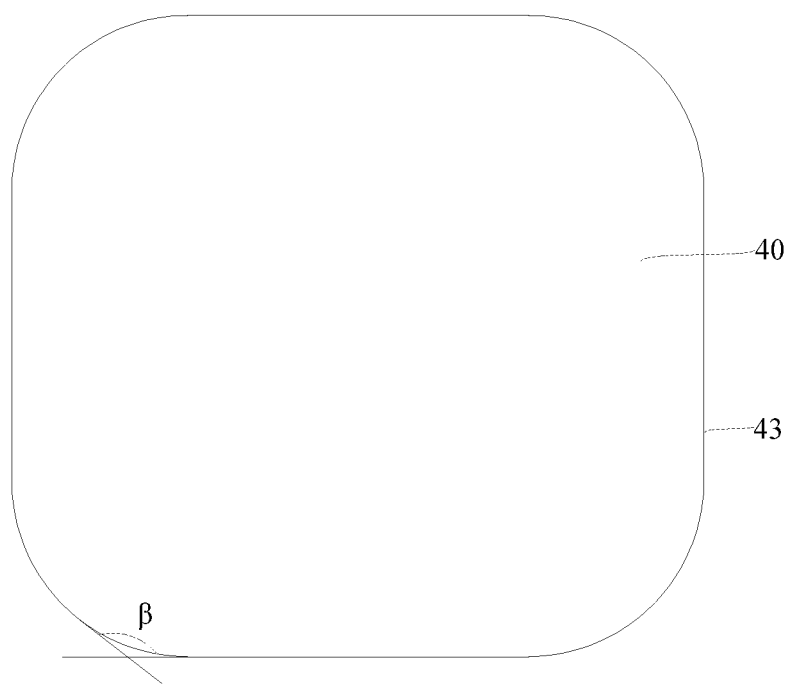
FIG. 8 is a first top view of a supporting layer according to an embodiment of the present application.

As shown in FIG. 8, the ring may include four connecting segments 43 connected end to end in sequence, and an arc is adopted for transition between two adjacent connecting segments 43, that is, the ring is a rectangular structure with a fillet. In this way, during the manufacturing process of the semiconductor structure, damage to the corner of the supporting layer 40 is reduced so as to protect the capacitor.

In some embodiments, the ring may further include multiple straight line segments 44 connected end to end in sequence, and an angle between the two straight line segments 44 that are at least partially adjacent is an obtuse angle. As shown in FIG. 9, the ring may also include eight straight line segments 44 connected end to end in sequence, thereby forming an octagonal structure. In this way, the production of the supporting layer 40 is facilitated, the preparation difficulty of the supporting layer 40 is reduced, and the production cost is saved.

As shown in FIG. 10, a second aspect of the embodiments of the present application further provides a manufacturing method of a semiconductor structure. The manufacturing method includes:

S100: Provide a substrate, the substrate including an array region and a peripheral circuit region surrounding the array region.

The substrate serves as a support component of the semiconductor structure and is used to support other components provided thereon. The substrate may be made of a semiconductor material. For example, the semiconductor material may be one of silicon, germanium, silicon-germanium and silicon-carbon or a combination of silicon, germanium, silicon-germanium and silicon-carbon.

S200: Form a supporting layer on the substrate.

In this step, a layer of insulating material may be deposited on the substrate by chemical deposition, physical deposition or evaporation, and this layer of insulating material defines a supporting layer.

For example, a first supporting layer, a first sacrificial layer, a second supporting layer, a second sacrificial layer and a third supporting layer may be sequentially deposited on the substrate by chemical deposition, physical deposition or evaporation. Capacitor holes penetrate at least the first sacrificial layer, the second supporting layer, the second sacrificial layer and the third supporting layer. The first supporting layer, the second supporting layer and the third supporting layer are respectively made of silicon nitride, and the first sacrificial layer and the second sacrificial layer are respectively made of silicon oxide.

S300: Form multiple capacitors in the supporting layer corresponding to the array region. The multiple capacitors are arranged in an array in the array region; virtual lines connecting centers of any three consecutively adjacent capacitors among multiple capacitors located at an edge of the array region define a virtual angle greater than 90°, as shown in FIGS. 3 to 6.

Figure 11:
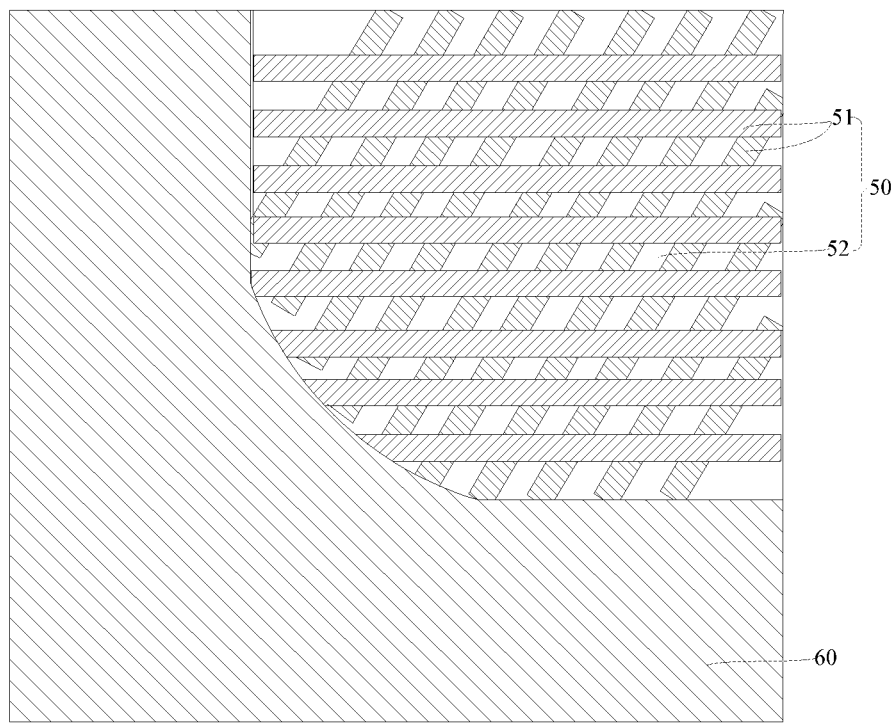
FIG. 11 is a first schematic diagram of a structure obtained after forming a first photoresist layer and a second photoresist layer by the manufacturing method of a semiconductor structure according to an embodiment of the present application.
Figure 12:
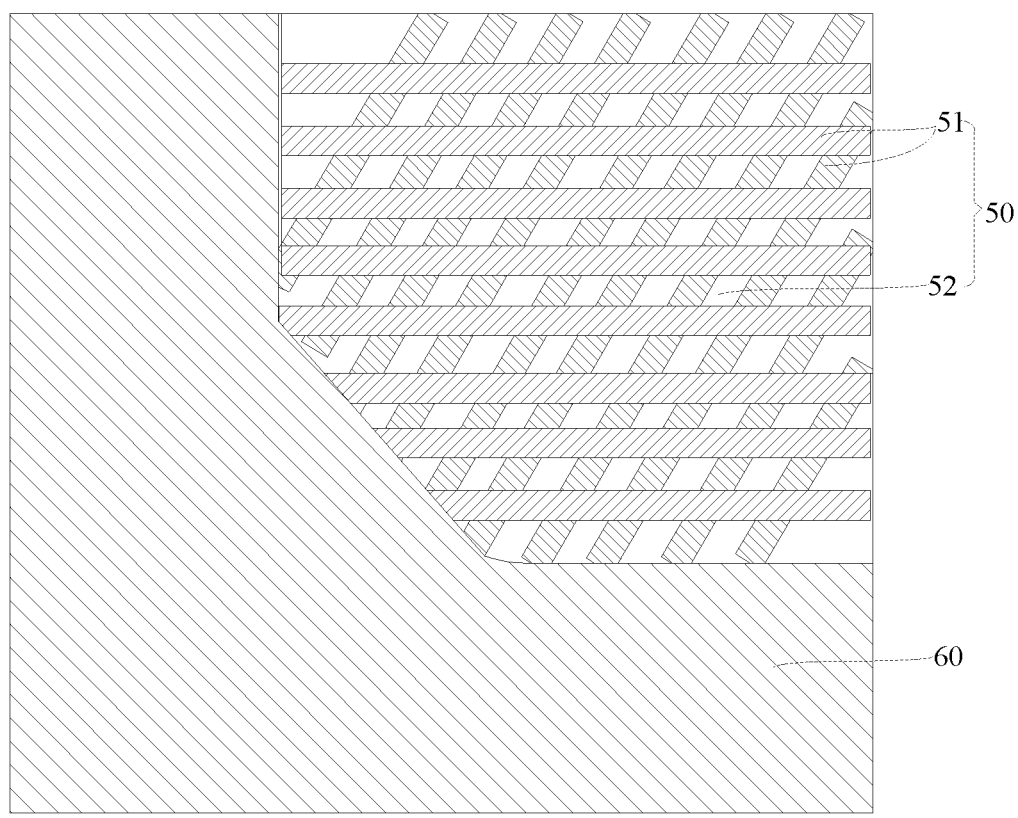
FIG. 12 is a second schematic diagram of a structure obtained after forming a first photoresist layer and a second photoresist layer by the manufacturing method of a semiconductor structure according to an embodiment of the present application.

This step may be implemented as follows:

S310: Form a first photoresist layer on the supporting layer corresponding to the array region. The first photoresist layer includes a first mask pattern; the first mask pattern includes multiple first shielding regions and multiple first opening regions that are alternately arranged, as shown in FIGS. 11 and 12.

The first photoresist layer is formed on the supporting layer 40 corresponding to the array region 10 by using a coating-curing method, an inkjet printing method or a deposition method. The first photoresist layer covers an upper surface of the supporting layer 40 corresponding to the array region 10.

The first photoresist layer is patterned through a patterning method such as masking, exposure, development or etching. The first photoresist layer includes a first mask pattern 50. The first mask pattern 50 includes multiple first shielding regions 51 and multiple first opening regions 52 that are alternately arranged.

S320: Form a second photoresist layer on the supporting layer 40 corresponding to the peripheral circuit region 20. The second photoresist layer is formed on the substrate corresponding to the peripheral circuit region by using a coating-curing method, an inkjet printing method or a deposition method. The second photoresist layer covers an upper surface of the supporting layer 40 corresponding to the peripheral circuit region 20.

The second photoresist layer is patterned through a patterning method such as masking, exposure, development or etching. The second photoresist layer includes a second mask pattern, and the second mask pattern includes a second shielding region 60 and a second opening region. The second shielding region 60 is used to cover part of the first shielding regions 51 and part of the first opening regions 52. An arc or a straight line segment is adopted for transition between two adjacent edges of the second shielding region 60.

Figure 14:
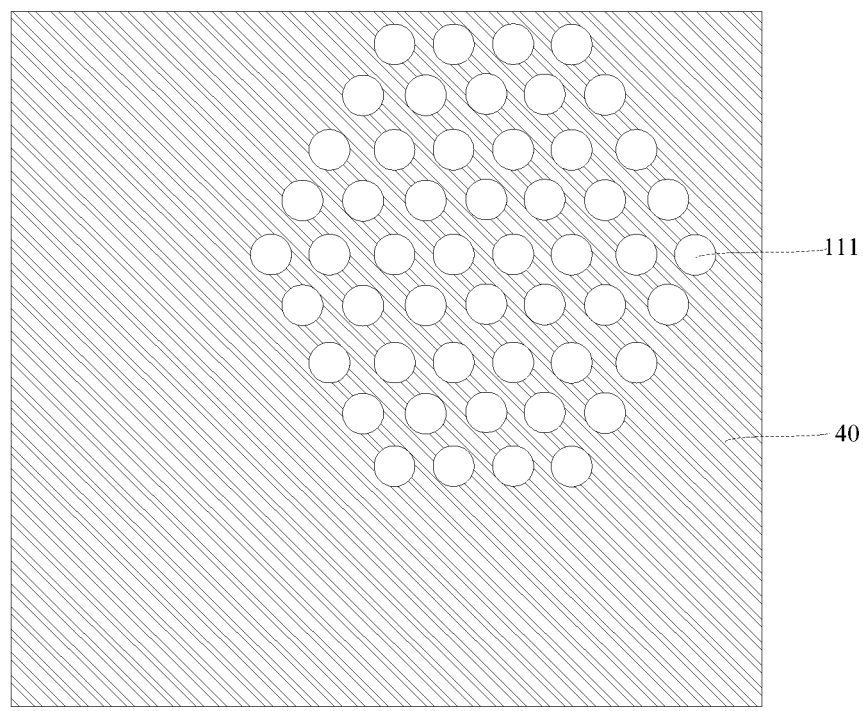
FIG. 14 is a schematic diagram of a structure obtained after forming a capacitor hole by the manufacturing method of a semiconductor structure according to an embodiment of the present application.

S330: Remove the supporting layer corresponding to the first opening regions, to form multiple capacitor holes in the supporting layer corresponding to the array region, as shown in FIG. 14.

In this step, a cleaning process, such as ultrasonic cleaning or plasma cleaning, may be used to remove the supporting layer 40 that needs to be removed, so as to retain the supporting layer 40 corresponding to the first shielding regions 51 and the second shielding region 60, thereby forming multiple capacitor holes 111 on the supporting layer 40.

In this embodiment, multiple capacitor holes 111 are arranged in an array in the array region 10. Virtual lines connecting centers of any three consecutively adjacent capacitor holes among the multiple capacitor holes 111 located at the edge 12 of the array region define a virtual angle greater than 90°.

Figure 13:
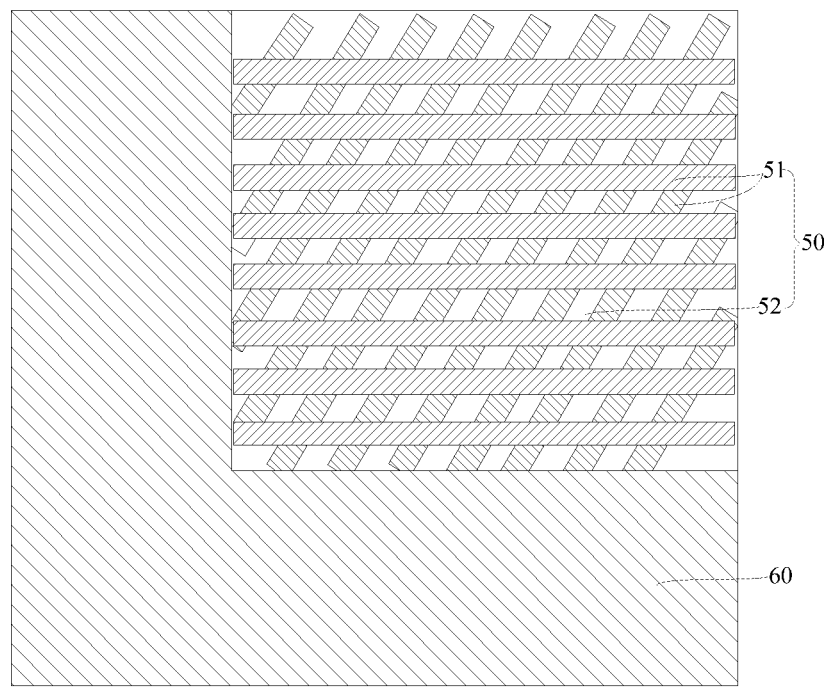
FIG. 13 is a schematic diagram of a structure obtained after forming a first photoresist layer and a second photoresist layer by a manufacturing method of a semiconductor structure in the related art.
Figure 15:
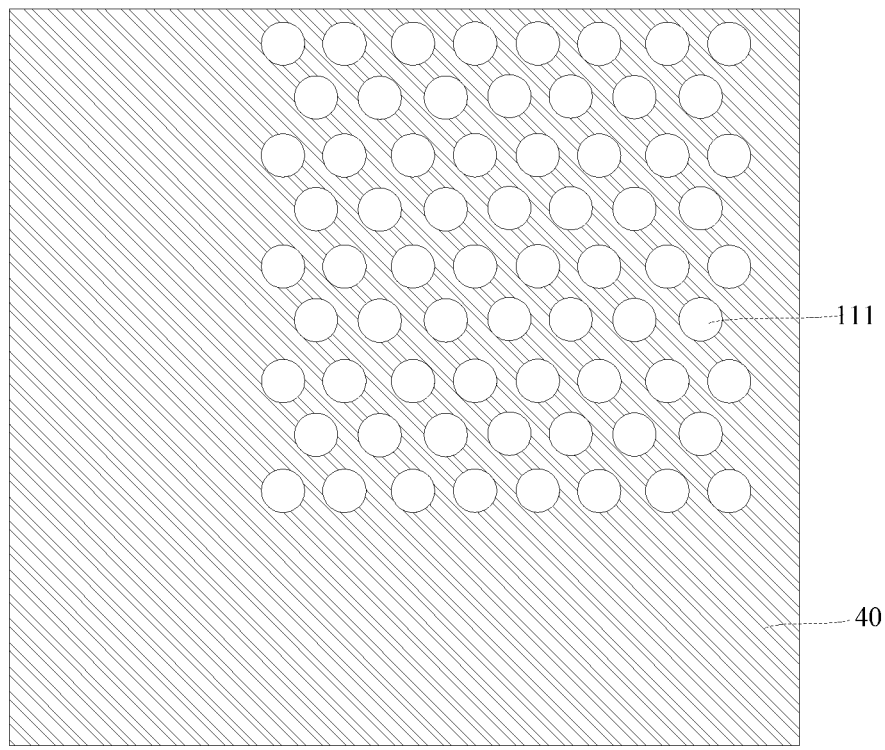
FIG. 15 is a schematic diagram of a structure obtained after forming a capacitor hole by the manufacturing method of a semiconductor structure in the related art.

In the related art, the second shielding region 60 is L-shaped, as shown in FIG. 13, such that multiple capacitor holes 111 formed subsequently, as shown in FIG. 15, are arranged in a rectangular array.

In this embodiment, the second photoresist layer is improved, that is, an arc or a straight line segment is adopted for transition between two adjacent edges of the second shielding region 60. Thus, the virtual lines connecting centers of any three consecutively adjacent capacitor holes among the multiple capacitor holes 111 located at the edge 12 of the array region define a virtual angle greater than 90°. The center lines of three adjacent capacitor holes among the multiple capacitor holes 111 located at the edge 12 of the array region are prevented from defining a right angle. That is, the multiple capacitor holes 111 located at the edge 12 of the array region are prevented from defining a rectangular pattern. In this way, the stress on the capacitor holes 111 at the edge 12 of the array region can be reduced, thereby reducing the probability of damage to the capacitors 11 at the edge 12 of the array region and improving the storage performance of the semiconductor structure.

S340: Remove the first photoresist layer and the second photoresist layer. In this step, a cleaning process, such as ultrasonic cleaning or plasma cleaning, may be used to remove the first photoresist layer and the second photoresist layer.

Figure 16:
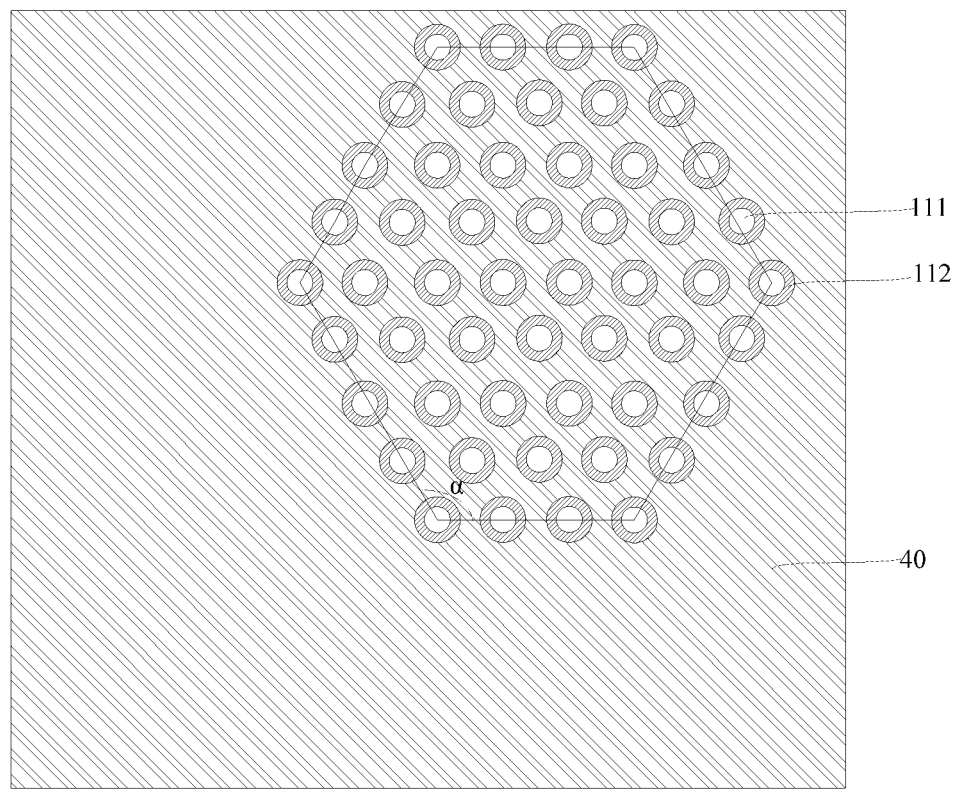
FIG. 16 is a schematic diagram of a structure obtained after forming a first electrode layer by the manufacturing method of a semiconductor structure according to an embodiment of the present application.

S350: Form a first electrode layer in the capacitor holes. As shown in FIG. 16, a first electrode layer 112 covering inner surfaces of the capacitor holes 111 is formed in the capacitor holes 111 by deposition.

Figure 17:
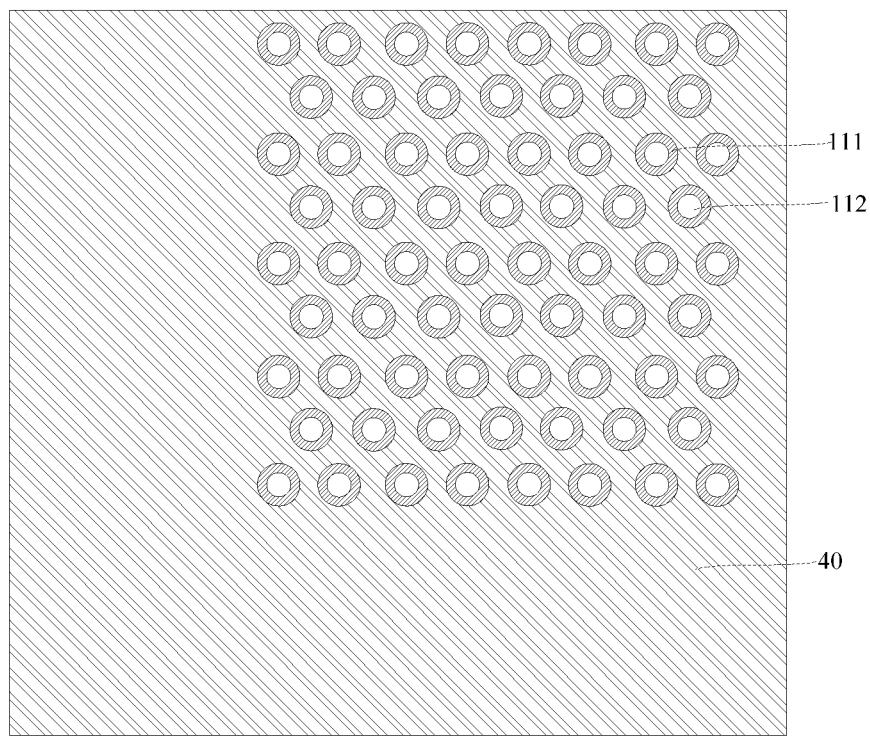
FIG. 17 is a schematic diagram of a structure obtained after forming a first electrode layer by the manufacturing method of a semiconductor structure in the related art.

In the related art, a first electrode layer 112 is also formed in the capacitor holes 111 by deposition, as shown in FIG. 17. In this embodiment, the virtual lines connecting centers of any three consecutively adjacent capacitor holes 111 among the multiple capacitor holes 111 located at the edge 12 of the array region define a virtual angle greater than 90°.

Figure 19:
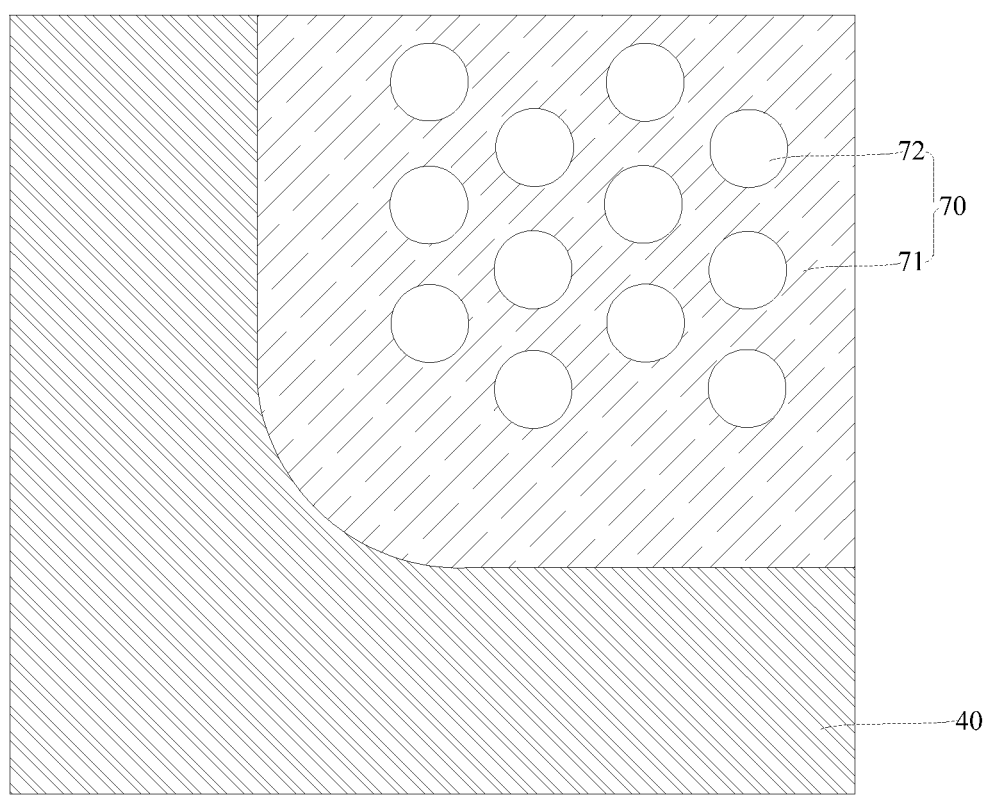
FIG. 19 is a schematic diagram of a structure obtained after forming a third photoresist layer by the manufacturing method of a semiconductor structure according to an embodiment of the present application.

S360: Form a third photoresist layer on the third supporting layer, as shown in FIG. 19.

Figure 18:
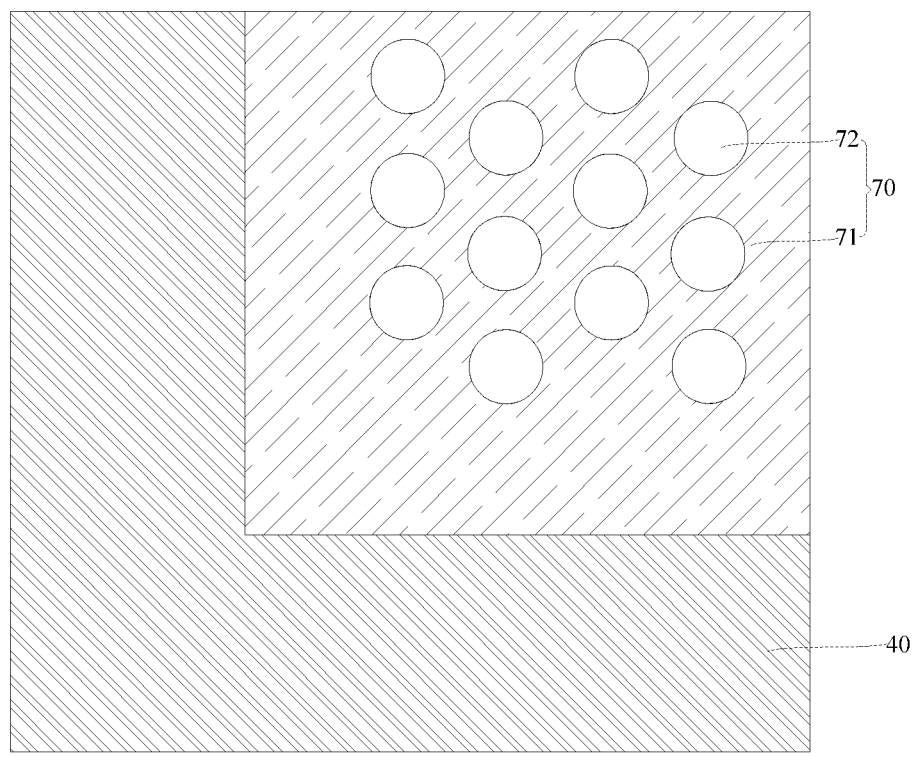
FIG. 18 is a schematic diagram of a structure obtained after forming a third photoresist layer by the manufacturing method of a semiconductor structure in the related art.

A third photoresist layer is formed on the third supporting layer by using a coating-curing method, an inkjet printing method or a deposition method. The third photoresist layer covers an upper surface of the third supporting layer, a projection of the third photoresist layer on the substrate 30 coincides with the array region 10, and the third photoresist layer is a rectangle with a fillet or chamfer. In the related art, the third photoresist layer is shown in FIG. 18, that is, the third photoresist layer is rectangular. The third photoresist layer provided in this embodiment can make the supporting layer subsequently prepared into a rectangle with a fillet or chamfer, so as to reduce damage to the corner of the supporting layer. Therefore, damage to the capacitor located at the corner of the supporting layer can be reduced, thereby ensuring the storage performance of the semiconductor structure.

The third photoresist layer is patterned to form a third mask pattern 70. The third mask pattern 70 includes multiple third shielding regions 71 and multiple third opening regions 72. A projection of each of the third opening regions 72 on the supporting layer 40 at least partially overlaps with a region between the capacitor holes 111.

The supporting layer 40 corresponding to the peripheral circuit region 20 is removed to retain the supporting layer 40 corresponding to the array region.

The third supporting layer corresponding to the third opening regions 72 and part of the first electrode layer 112 are removed to expose the second sacrificial layer corresponding to the third opening regions 72. The retained third supporting layer defines the top supporting layer 41.

The second sacrificial layer, part of the second supporting layer and the first sacrificial layer are removed. The retained second supporting layer defines the intermediate supporting layer 42, and the retained first supporting layer defines the bottom supporting layer.

In this step, multiple fourth opening regions (not shown in the figure) arranged at intervals may be formed on the second supporting layer, and a fourth shielding region is formed between adjacent fourth openings. A projection of each of the fourth opening regions on the second supporting layer at least partially overlaps with a region between the capacitor holes.

The second supporting layer and part of the first electrode layer corresponding to the fourth opening regions are removed to expose the first sacrificial layer corresponding to the fourth opening regions.

The first sacrificial layer is removed, and the retained second supporting layer defines the intermediate supporting layer 42.

S370: Form a second electrode layer and a dielectric layer covering the first electrode layer in each of the capacitor holes, where the first electrode layer, the dielectric layer and the second electrode layer define the capacitor.

In the manufacturing method of a semiconductor structure provided by the embodiment of the present application, multiple capacitors are formed in the array region. The virtual lines connecting centers of any three consecutively adjacent capacitors among multiple capacitors located at the edge of the array region define a virtual angle greater than 90°. The virtual lines connecting centers of any three consecutively adjacent capacitors among the multiple capacitors located at the edge of the array region are prevented from defining at least a right angle, so as to prevent the multiple capacitors located at the edge of the array region from defining a rectangular pattern. In this way, the stress on the multiple capacitors located at the edge of the array region can be reduced, thereby reducing the probability of damage to the multiple capacitors located at the edge of the array region and improving the storage performance of the semiconductor structure.

Each embodiment in the specification of the present application is described in a progressive manner. Each embodiment focuses on the difference from other embodiments, and the same and similar parts between the embodiments may refer to each other.

In the descriptions of this specification, a description with reference to the term "one implementation", "some implementations", "an exemplary implementation", "an example", "a specific example", "some examples", or the like means that a specific feature, structure, material, or characteristic described in combination with the implementation(s) or example(s) is included in at least one implementation or example of the present application. In this specification, the schematic expression of the above terms does not necessarily refer to the same implementation or example. Moreover, the described specific feature, structure, material or characteristic may be combined in an appropriate manner in any one or more implementations or examples.

Finally, it should be noted that the above embodiments are merely used to explain the technical solutions of the present application, but are not intended to limit the present application. Although the present application is described in detail with reference to the foregoing embodiments, those of ordinary skill in the art should understand that they can still modify the technical solutions described in the foregoing embodiments, or make equivalent substitutions on some or all technical features therein. These modifications or substitutions do not make the essence of the corresponding technical solutions deviate from the spirit and scope of the technical solutions of the embodiments of the present application.

The invention claimed is:

1. A semiconductor structure, comprising a substrate, wherein the substrate comprises an array region and a peripheral circuit region surrounding the array region;

multiple capacitors are arranged in an array in the array region; virtual lines connecting centers of any three consecutively adjacent capacitors among the multiple capacitors located at an edge of the array region define a virtual angle greater than 90°;

wherein the semiconductor structure further comprises a supporting layer provided on the substrate, a first mask pattern is formed on the supporting layer corresponding to the array region, the first mask pattern comprises multiple first shielding regions and multiple first opening regions that are alternately arranged; wherein a second mask pattern is formed on the supporting layer corresponding to the peripheral circuit region, the second mask pattern comprises a second shielding region and a second opening region; wherein the second shielding region covers part of the first shielding regions and part of the first opening regions; wherein an arc is adopted for transition between two adjacent edges of the second shielding region;

wherein multiple capacitor holes are formed on the supporting layer by removing the supporting layer corresponding to the first opening regions, a first electrode layer is formed in the capacitor holes; wherein the supporting layer comprises a first supporting layer, a first sacrificial layer, a second supporting layer, a second sacrificial layer and a third supporting layer successively stacked, wherein the capacitor holes penetrate at least the first sacrificial layer, the second supporting layer, the second sacrificial layer and the third supporting layer;

wherein a third mask pattern is formed on the third supporting layer, wherein the third mask pattern comprises multiple third shielding regions and multiple third opening regions; a projection of each of the third opening regions on the supporting layer at least partially overlaps with a region between the capacitor holes; by removing the supporting layer corresponding to the peripheral circuit region, the supporting layer corresponding to the array region is retained; by removing the third supporting layer corresponding to the third opening regions and part of the first electrode layer, the second sacrificial layer corresponding to the third opening region is exposed, wherein the retained third supporting layer defines a top supporting layer; and by removing the second sacrificial layer, part of the second supporting layer, and the first sacrificial layer, the retained second supporting layer defines an intermediate supporting layer, and the retained first supporting layer defines a bottom supporting layer.

2. The semiconductor structure according to claim 1, wherein the multiple capacitors arranged in an array comprise multiple rows of capacitor banks and multiple columns of capacitor banks; the multiple capacitors located at the edge of the array region comprise the capacitors located at end points of the multiple rows of capacitor banks and the multiple columns of capacitor banks.

3. The semiconductor structure according to claim 2, wherein virtual lines connecting centers of all the capacitors located at the end points of the multiple rows of capacitor banks and the multiple columns of capacitor banks define a rectangle with a chamfer.

4. The semiconductor structure according to claim 3, wherein in the rectangle with a chamfer, the virtual lines connecting any two centers of the capacitors respectively located on two adjacent right-angled sides and one center of the capacitor located on the chamfer between the two adjacent right-angled sides define a virtual obtuse triangle.

5. The semiconductor structure according to claim 2, wherein, on a chamfer the capacitors located at end points of adjacent rows are also located on different columns, and the capacitors located at end points of adjacent columns are also located on different rows.

6. The semiconductor structure according to claim 2, wherein a perpendicular distance between two adjacent rows is not equal to a perpendicular distance between two adjacent columns.

7. The semiconductor structure according to claim 1, wherein one capacitor is provided in each of the capacitor holes.

8. The semiconductor structure according to claim 7, wherein an outer contour of a cross section, of the supporting layer, parallel to the substrate is a circle or ring.

9. The semiconductor structure according to claim 8, wherein the ring comprises multiple connecting segments connected end to end in sequence, and an arc is adopted for transition between two connecting segments that are at least partially adjacent; alternatively, the ring comprises multiple straight line segments connected end to end in sequence, and an angle between two straight line segments that are at least partially adjacent is an obtuse angle.

10. The semiconductor structure according to claim 9, wherein an angle between a tangent direction of the arc between the two connecting segments and the two connecting segments connected by the arc is an obtuse angle.

11. A method of manufacturing a semiconductor structure, comprising:

providing a substrate, the substrate comprising an array region and a peripheral circuit region surrounding the array region;

forming a supporting layer on the substrate; and forming multiple capacitors in the supporting layer corresponding to the array region, wherein the multiple capacitors are arranged in an array in the array region; virtual lines connecting centers of any three consecutively adjacent capacitors among the multiple capacitors located at an edge of the array region define a virtual angle greater than 90°;

wherein the step of forming multiple capacitors in the supporting layer corresponding to the array region comprises: forming a first photoresist layer on the supporting layer corresponding to the array region, wherein the first photoresist layer comprises a first mask pattern; the first mask pattern comprises multiple first shielding regions and multiple first opening regions that are alternately arranged; forming a second photoresist layer on the supporting layer corresponding to the peripheral circuit region, wherein the second photoresist layer comprises a second mask pattern; the second mask pattern comprises a second shielding region and a second opening region; the second shielding region is used to cover part of the first shielding regions and part of the first opening regions; an arc is adopted for transition between two adjacent edges of the second shielding region; removing the supporting layer corresponding to the first opening regions, to form multiple capacitor holes in the supporting layer corresponding to the array region; and forming a first electrode layer in the capacitor holes;

wherein the step of forming a supporting layer on the substrate comprises sequentially stacking a first supporting layer, a first sacrificial layer, a second supporting layer, a second sacrificial layer and a third supporting layer on the substrate, wherein the capacitor holes penetrate at least the first sacrificial layer, the second supporting layer, the second sacrificial layer and the third supporting layer;

wherein after the forming a first electrode layer in the capacitor holes, the method further comprises: forming a third photoresist layer on the third supporting layer; patterning the third photoresist layer to form a third mask pattern, wherein the third mask pattern comprises multiple third shielding regions and multiple third opening regions; a projection of each of the third opening regions on the supporting layer at least partially overlaps with a region between the capacitor holes; removing the supporting layer corresponding to the peripheral circuit region to retain the supporting layer corresponding to the array region; removing the third supporting layer corresponding to the third opening regions and part of the first electrode layer to expose the second sacrificial layer corresponding to the third opening region, wherein the retained third supporting layer defines a top supporting layer; and removing the second sacrificial layer, part of the second supporting layer, and the first sacrificial layer, wherein the retained second supporting layer defines an intermediate supporting layer, and the retained first supporting layer defines a bottom supporting layer.

12. The method according to claim 11, wherein after the removing the supporting layer corresponding to the first opening regions, and before the forming a first electrode layer in the capacitor holes, the method further comprises: removing the first photoresist layer and the second photoresist layer.

13. The method according to claim 11, wherein after removing the supporting layer corresponding to the peripheral circuit region, the method further comprises:

forming a second electrode layer and a dielectric layer covering the first electrode layer in each of the capacitor holes, wherein the first electrode layer, the dielectric layer and the second electrode layer define the capacitor.

* * * * *

UNITED STATES PATENT AND TRADEMARK OFFICE
CERTIFICATE OF CORRECTION

Page 1 of 1

PATENT NO. : 11,622,488 B2
APPLICATION NO. : 17/439894
DATED : April 4, 2023
INVENTOR(S) : Feng Wu et al.

It is certified that error appears in the above-identified patent and that said Letters Patent is hereby corrected as shown below:

On the Title Page

Item (73) Please insert:
--CHANGXIN MEMORY TECHNOLOGIES, INC., HEFEI (CN)--

Signed and Sealed this
Twenty-second Day of August, 2023

Katherine Kelly Vidal
*Director of the United States Patent and Trademark Office*